United States Patent [19]

Rallison

[11] Patent Number: 4,913,990

[45] Date of Patent: Apr. 3, 1990

[54] METHOD OF TUNING A VOLUME PHASE RECORDING

[76] Inventor: Richard D. Rallison, Box 142, 8501 S. 400 West, Paradise, Utah 84328

[21] Appl. No.: 110,459

[22] Filed: Oct. 20, 1987

[51] Int. Cl.$^4$ ............................................. G03C 5/39
[52] U.S. Cl. .......................................... 430/30; 430/1; 430/12; 430/328; 430/325; 350/3.61
[58] Field of Search ...................... 430/1, 2, 30, 4, 12, 430/17, 18, 320, 321, 325, 328, 331; 350/3.61

[56] References Cited

U.S. PATENT DOCUMENTS

| | | | |
|---|---|---|---|
| 4,509,817 | 4/1985 | Ho et al. | 350/3.61 |
| 4,789,211 | 12/1988 | Wreede | 350/3.61 |
| 4,808,500 | 2/1989 | Wreede et al. | 430/1 |

OTHER PUBLICATIONS

"Norland Optical Adhesive 61", Norland Products, Inc., N.J.

Primary Examiner—Jose G. Dees
Attorney, Agent, or Firm—Staas & Halsey

[57] ABSTRACT

The present invention tunes and stabilizes a volume hologram by migrating an ultraviolet sensitive epoxy resin into the hologram with a solvent, causing the volume hologram to swell and shift its center frequency. When a sufficient shift has occurred, the epoxy resin is exposed to ultraviolet light, setting the resin and preventing further change. An appropriate resin-solvent solution can be arrived at for different media by slowly changing the ratio of solvent to resin and observing the end product until the desired frequency shift and broadbanding is observed with visually or with a spectrometer.

7 Claims, 1 Drawing Sheet

METHOD OF TUNING A VOLUME PHASE RECORDING

BACKGROUND OF THE INVENTION

1. Field of the Invention

The present invention is directed to tuning volume holograms and, more particularly, to a method of broadening the bandwidth and/or shifting the transmission and reflection frequencies of volume holograms and stabilizing the resulting film from further change and damage.

2. Description of the Related Art

Volume holograms are characterized by three dimensional Bragg planes created throughout the volume of the recording medium. The recording medium when developed includes a very delicate microstructure which is easily damaged by abrasion, pressure, moisture and organic solvents. The holograms are typically used as transmissive or reflective filters and it is difficult to produce a filter that operates at wavelengths longer than the recording wavelength. Once created, the center frequency of the hologram tends to drift over time toward the blue end of the visible light spectrum. This drift is caused by the gradual collapse of the microstructure of the Bragg planes. It is desirable to make these structures rigid, resistant to abrasion and resistant to frequency shift.

The prior art technique for protecting the hologram film is to encapsulate the hologram in glass or plastic to protect the film from abrasion, solvents and moisture. This technique does not prevent center frequency shift and the hologram continues to drift in playback color.

SUMMARY OF THE INVENTION

It is an object of the present invention to controllably shift the center frequency of a volume hologram and stabilize the shift.

It is another object of the present invention to broaden the bandwidth of a volume hologram and stabilize the increased bandwidth.

It is an additional object of the present invention to produce a volume hologram that will not be affected by environmental factors such as humidity and organic solvents.

It is a further object of the present invention to create a hologram with a gradient in the distance between Bragg planes in the film.

It is still another object of the present invention to change the Bragg plane structure without completely filling the low density regions between Bragg planes.

The present invention attains the above objects by migrating an ultraviolet sensitive adhesive or epoxy resin into the hologram microstructure with a solvent, causing the volume hologram to swell, shift its center frequency and broaden its bandwidth. When a sufficient shift has occurred, the adhesive is exposed to ultraviolet light, setting the resin and preventing further change.

These together with other objects and advantages which will be subsequently apparent reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 1:
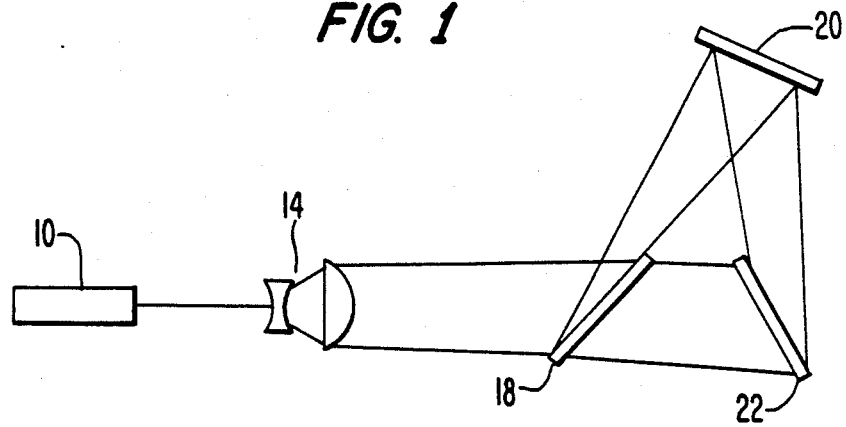
FIG. 1 illustrates an apparatus for creating a reflection volume hologram.

To create a volume hologram a laser 10, as illustrated in FIG. 1, produces a coherent beam 12 which is expanded by a series of conventional lenses 14 into a larger beam 16. Part of the beam 16 is reflected by a conventional half reflecting mirror 18 onto a target 20. The target 20 produces a reflection image that encounters a conventional recording medium 22 such as dichromate gelatin. The portion of the beam 16 that is transmitted by the mirror 18 also encounters the recording medium 22. The combination of the beam 16 and the reflection image from the target 20 creates interference regions in the recording medium 22 called Bragg planes. These interference regions are three dimensional planes of refractive index change and cause light passing through the developed film to be reflected. The frequency of the reflected light is determined by the space between the planes, allowing the film to act as a frequency filter.

Figure 2:
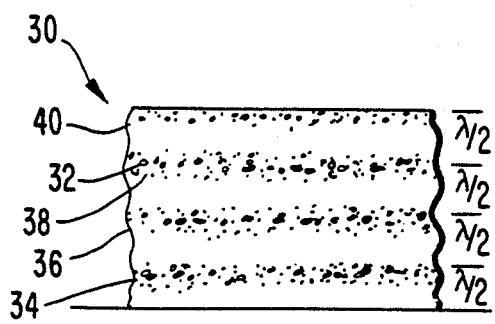
FIG. 2 illustrates a reflection volume hologram after development.

The recording medium 22 is then developed using standard developing techniques. For example, when a dichromate gelatin is developed the unexposed chromate is removed from the medium 22 and a volume hologram 30 results that has a microstructure much like a sponge with varying high and low density regions 32 throughout the material, as illustrated in FIG. 2. The layers 34-40 of variable density 32 define the Bragg planes, that is, the regions of refractive index change.

The hologram 30 can act as a transmissive or reflection filter and can be used to narrow the spectrum of a broadband source of light.

Because the recording medium 22 after developing is porous and not solid, it will readily absorb moisture and solvents and tends to collapse over time especially when under small amounts of pressure. The present invention stops these deleterious effects from occurring by supporting the microstructure with a cured epoxy resin. An ultraviolet sensitive adhesive or epoxy resin is mixed with a solvent and spread over the surface of the volume hologram 30, also at room temperatures, in very thin layer. Room temperature is preferred, however, the solubility of the volume hologram is a function of temperature and time. The rate at which the solvent/epoxy solution is absorbed or taken up by the hologram can be adjusted by raising or lowering the temperature of the components. Increases in solution temperature increases absorption speed. The solvent carries the resin into the microstructure and causes the hologram to swell like a sponge filling with water. As the holograms swells the center frequency of the hologram shifts toward the red end of the spectrum and the bandwidth broadens. When the desired amount of shift has occurred, the hologram is exposed to ultraviolet light which sets all the epoxy resin and prevents further changes in the microstructure. The solvent is then allowed to evaporate leaving only the hologram and the cured resin. The cured epoxy resin supports the microstructure and prevents changes from occurring when exposed to moisture or solvents. The resin on the surface of the hologram provides a protective coating that prevents scratching.

Figure 3:
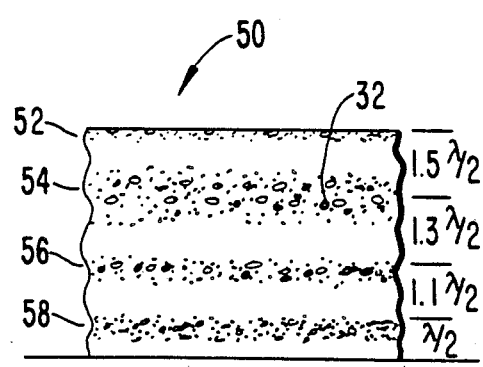
FIG. 3 illustrates a volume hologram with the center frequency shifted and stabilized in accordance with the present invention.

FIG. 3 illustrates an expanded and stabilized hologram 50 in which the solvent/resin solution was applied to the top surface of the hologram. As can be seen, the distance between the Bragg planes 52-58 increases toward the top surface because more solvent and resin was present in the top layers when the epoxy was exposed to the ultraviolet light. The expansion of the distance between the Bragg planes shifts the center frequency of the hologram and broadens the operating region. The change in distance produces a gradient in the distance change.

Typically, the epoxy resin is mixed with a small amount of solvent and spread over the hologram 30 with a bar or sponge producing a light film on or dampening of the hologram. If the hologram is saturated, the desired effects will not be produced. As the solvent/epoxy solution migrates into the hologram, the color of the hologram will change when back lit with a white spectrum light source such as a clear incandescent light bulb or the color reflected off the hologram will change when the light is reflected from the top of the hologram. When the color change has stopped and the process has gone to completion or when the color change reaches a desired spectral shift, the hologram is exposed to ultraviolet light from a mercury arc lamp or xenon lamp. The ultraviolet light sets the epoxy resin and stops any further color change. The xenon lamp will effect the most rapid setting of the resin because it produces higher ultraviolet flux. The color change of the hologram can then be determined visually or with a spectrometer.

If the color shift has been too far, the ratio of epoxy resin to solvent is increased (i.e., more resin) and the coating and curing steps are repeated on a new hologram. If the color shift is not far enough the ratio of epoxy resin to solvent is decreased for a new hologram. By small adjustments in the solventepoxy ratio, an appropriate solution can be obtained which will produce the desired results. The object is to provide the right amount of solvent to cause swelling without filing the large low density regions between Bragg planes; thereby maintaining the original brightness, efficiency and index modulation. Particular changes in the above procedure will be discussed for various holographic recording media as discussed below.

Polaroid makes a volume phase material known as DMP-128. After polymerization (development) this structure may be stabilized against collapse from water absorption by a fatty acid in a technique developed and available from Polaroid. The volume hologram can also be tuned by filing the low density areas with various solvents that do not soften the structure. One drop of the epoxy resin GRACE 611 available from W.R. Grace and Company is mixed with 1 milliliter of 29-H diluent available from W.R. Grace and Company and 1 milliliter of methanol or ethanol. This solution is spread over the hologram film using a coating bar or simply wiped on with a soft cloth or tissue. The reconstruction wavelengths of the hologram shift immediately toward the red end of the spectrum and broaden significantly. For example, the bandwidth can be increased from about 30 nanometers to 100 nanometers or from blue only to blue plus green plus yellow. As the solvent evaporates a final brighter and more broadband reconstruction remain which may be set with ultraviolet light from a mercury arc or Xenon lamp during or after evaporation of the solvent. The application of heat during this process such as applied from common sun lamp, will help avoid the condensation of moisture on the hologram as well as increase the speed of the shifting process. Small shifts in frequency may be accomplished by repeated applications and by altering the ratio of the resin mixture to alcohol. That is, uncured resin will continue to migrate through this structural material even after epoxy has been cured in the hologram. In any mass production operation large baths may be mixed for rapid dip coating with ultraviolet curing steps in between.

DuPont has recently produced a new reflection holographic material designated only as an experimental acrylamide which is processed with only ultraviolet light and is generally hydrophobic. The DuPont media lacks index modulation unless treated with a solvent, however, the solvent treatment produces only temporary effects. GRACE 611, NOA or NOA-61 available from Norland Products, Inc., GRACE 15D, LIGHTWELD 401, LIGHTWELD 415 or LIGHTWELD 456 available from American Chemical and Engineering Company resins can be used to tune and stabilize this media. This material will respond to pure epoxy resin to some degree and if a change of greater magnitude is desired a very small amount of a diluent or solvent can be added to the resin. This material is easily destroyed by solvents so only small amounts of mild solvents such as ethanol should be used. For example, mixing 29-H diluent with equal parts of GRACE 611 and applying the solution evenly over the surface of the hologram with a bar will produce a large shift and a broader bandwidth. This mixture will take several minutes to go to completion with the desired frequency shift. If the frequency shift is not sufficient a small amount of ethanol such as five drops to a 1 milliliter mixture of diluent and GRACE 611 will improve the amount of the frequency shift. When the desired shift has been observed visually or with a spectrometer a rapid cure is needed using an industrial Xenon lamp from the Xenon Corporation rather than a mercury arc lamp. The LIGHTWELD 401 and 456 will also produce good results.

A method for shifting the wavelength of this newer DuPont material from blue to green or green to yellow is to evenly cover the surface of the hologram with LIGHTWELD 401 and apply a thin sheet of mylar over the coated hologram. When the entire hologram becomes green or if it began as green when it becomes yellow, a Xenon flash lamp is pulsed to set the resin. Once the desired color change has occurred very quick application of high intensity ultraviolet light is necessary. If the adhesive is left uncured for too long it will soften and match out the original hologram leaving only a clear piece of plastic behind. That is, the space between the Bragg planes becomes filled with index matching fluid and no index modulation remains.

In a PVK hologram media available from Allied Chemical Company and DCG hologram media available from Kind nd Knox, Inc. small tuning and bandwidth changes can be made. Both of these materials are prone to rapid collapse of their Bragg structures and as a result only small changes can be made. A mixture of one milliliters of MEK available from any hardware store and one milliliters of 29-H diluent or one milliliters of acetone and the same amount of diluent or either one milliliters of solvent and one milliliters of LIGHTWELD 401 will also produce a small change in wavelength when applied to these materials.

A small amount of MEK such as five drops in one milliliter of GRACE 611 is also useful in tuning PVK that has been broadbanded by severe shock drying. The noise created by the shock drying is reduced while preserving the Bragg structure. Small shifts toward the green portion of the spectrum can be obtained in the narrowband blue regions of the hologram with the same mixture.

Of the holograms processed in accordance with the present invention the most rugged and resistant to environmental fluctuations is the PVK material with the DuPont material being the most resistant to moisture but more rubbery and less versatile. The instabilities associated with DMP 28 including cracking and ultraviolet damage are alleviated using the techniques of the present invention. This technique can be used with other photopolymers and those developed in the future to tune and broadband these polymers when containing a volume phase recording.

The many features and advantages of the present invention are apparent from the detailed specification and thus it is intended by the appended claims to cover all such features and advantages of the invention which fall within the true spirit and scope thereof. Further, since numerous modifications and changes will readily occur to those skilled in the art, it is not desired to limit the invention to the exact method and apparatus described. Accordingly, all suitable modifications and equivalents may be resorted to, falling within the scope of the invention.

I claim:

1. A method of processing a recording medium having a porous structure, comprising the steps of:
    (a) applying a solvent and resin mixture solution to the recording medium;
    (b) allowing the mixture solution to migrate into the recording medium without filling the structure; and
    (c) setting the resin after a desired change in the recording medium is detected and removing the solvent.

2. A method as recited in claim 1, wherein the recording medium comprises a volume hologram, the resin comprises an ultraviolet light sensitive resin and the resin is set using ultraviolet light.

3. A method of processing a recording medium having a porous structure, comprising the steps of:
    (a) applying a solvent and resin mixture solution to the recording medium, comprising the steps of:
        (a1) mixing the solvent with the resin to form the mixture solution; and
        (a2) spreading the mixture solution over a surface of the medium causing the medium to swell;
    (b) allowing the mixture solution to migrate into the recording medium without filling the structure; and
    (c) setting the resin after a desired change in the recording medium is detected.

4. A method of processing a recording medium having a porous structure, comprising the steps of:
    (a) applying a solvent and resin mixture solution to the recording medium;
    (b) allowing the mixture solution to migrate into the recording medium without filling the structure; and
    (c) setting the resin after a desired change in the recording medium is detected, comprising the steps of:
        (c1) detecting a desired shift in the center frequency of the medium;
        (c2) radiating the medium in ultraviolet light responsive to the detection; and
        (c3) evaporating the solvent.

5. A method of tuning a volume hologram having a porous structure, comprising the steps of:
    (a) combining a resin with a sufficient amount of solvent to obtain a desired changed in the hologram;
    (b) applying the combined resin and solvent to the hologram;
    (c) allowing the combined resin and solvent to migrate substantially into the volume hologram without filling the structure; and
    (d) setting the resin.

6. A method of tuning a volume hologram having a porous structure, comprising the steps of:
    (a) changing a spacing between Bragg planes in the hologram by migrating a resin-solvent solution into the hologram without filling the structure; and
    (b) fixing the spacing by setting the resin and removing the solvent.

7. A method of tuning a volume hologram recorded in a developed recording medium having a porous structure and, comprising the steps of:
    (a) mixing a solvent with an ultraviolet light settable resin to produce a stabilization solution;
    (b) spreading the stabilization solution over the surface of the recording medium;
    (c) allowing the stabilization solution to migrate into the recording medium without filling the recording medium;
    (d) detecting a desired change in a frequency spectrum of the hologram;
    (e) irradiating the hologram with ultraviolet light thereby setting the resin; and
    (f) heating the hologram and driving out the solvent.

* * * * *